(12) United States Patent
Kahen et al.

(10) Patent No.: US 6,870,868 B2
(45) Date of Patent: Mar. 22, 2005

(54) ORGANIC LASER HAVING IMPROVED LINEARITY

(75) Inventors: Keith B. Kahen, Rochester, NY (US); John A. Lebens, Rush, NY (US)

(73) Assignee: Eastman Kodak Company, Rochester, NY (US)

(*) Notice: Subject to any disclaimer, the term of this patent is extended or adjusted under 35 U.S.C. 154(b) by 87 days.

(21) Appl. No.: 10/368,164

(22) Filed: Feb. 18, 2003

(65) Prior Publication Data

US 2004/0161004 A1 Aug. 19, 2004

(51) Int. Cl.[7] ................................................. H01S 3/14
(52) U.S. Cl. .............................. 372/39; 372/40; 372/41; 372/42; 372/43; 372/44; 372/45; 372/46; 372/47; 372/48; 372/49; 372/50; 372/70; 372/96
(58) Field of Search .............................. 372/39–50, 70, 372/96

(56) References Cited

U.S. PATENT DOCUMENTS

| | | | |
|---|---|---|---|
| 5,881,083 A | | 3/1999 | Diaz-Garcia et al. |
| 5,881,089 A | | 3/1999 | Berggren et al. |
| 6,160,828 A | | 12/2000 | Kozlov et al. |
| 6,194,119 B1 | * | 2/2001 | Wolk et al. ............... 430/200 |
| 6,392,250 B1 | * | 5/2002 | Aziz et al. ............... 257/40 |
| 6,406,801 B1 | * | 6/2002 | Tokito et al. ............ 428/690 |
| 6,658,037 B2 | * | 12/2003 | Kahen et al. ............. 372/70 |
| 6,687,274 B2 | * | 2/2004 | Kahen ..................... 372/39 |
| 6,728,278 B2 | * | 4/2004 | Kahen et al. ............. 372/39 |
| 6,790,696 B1 | * | 9/2004 | Kahen ..................... 438/34 |
| 2004/0076198 A1 | * | 4/2004 | Spoonhower et al. ...... 372/20 |

OTHER PUBLICATIONS

"Circular Buried Heterostructure (CBH) GaAlAs/GaAs Surface Emitting Lasers", by Susumu Kinoshita et al., IEEE Journal of Quantum Electronics, vol. QE–23, No. 6, Jun. 1987, pp. 882–889.

"Vertical–Cavity Surface Emitting Lasers: Moving from Research to Manufacturing" by Kent D. Choquette, Proceedings of the IEEE, vol. 85, No. 11, Nov. 1997, pp. 1730–1739.

"Vertical–Cavity Surface–Emitting Lasers", by Carl W. Wilmsen, Cambridge University Press, Cambridge, 2001.

T. Ishigure et al., Electron. Lett. 31, 467 (1995).

"Pulsed excitation of low–mobility light–emitting diodes: implication for organic lasers", by N. Tessler et al., Applied Physics Letters, vol. 85, No. 19, May 10, 1999, pp. 2764–2766.

"Light amplification in organic thin films using cascade energy transfer", by M. Berggren, et al., Nature vol. 389, Oct. 2, 1997, pp. 466–469.

"Design of Fabry–Perot Surface–Emitting Lasers with a Periodic Gain Structure", by Scott W. Corzine et al., IEEE Journal of Quantum Electronics, vol. 25, No. 6, Jun. 1989, pp. 1513–1524.

* cited by examiner

*Primary Examiner*—Mingun Oh Harvey
*Assistant Examiner*—Delma R. Flores-Ruiz
(74) *Attorney, Agent, or Firm*—Raymond L. Owens

(57) ABSTRACT

An organic vertical cavity laser device includes a substrate; a bottom dielectric stack reflective to light over a predetermined range of wavelengths and being disposed over the substrate, and an organic active region for producing laser light. The device also includes a top dielectric stack spaced from the bottom dielectric stack and reflective to light over a predetermined range of wavelengths, and a thermally conductive transparent layer disposed between the bottom dielectric stack and the organic active region or between the top dielectric stack and the organic active region or both.

13 Claims, 6 Drawing Sheets

ORGANIC LASER HAVING IMPROVED LINEARITY

CROSS REFERENCE TO RELATED APPLICATIONS

Reference is made to commonly assigned U.S. patent application Ser. No. 10/066,936 filed Feb. 4, 2002 by Keith B. Kahen et al., entitled "Organic Vertical Cavity Lasing Devices Containing Periodic Gain Regions"; commonly assigned U.S. patent application Ser. No. 10/066,829 filed Feb. 4, 2002 by Keith B. Kahen, entitled "Organic Vertical Cavity Phase-Locked Laser Array Device"; and commonly assigned U.S. patent application Ser. No. 10/269,652 filed Oct. 11, 2002 by Keith B. Kahen et al., entitled "Organic Vertical Cavity Lasing Devices Having Organic Active Region", the disclosures of which are herein incorporated by reference.

FIELD OF THE INVENTION

The present invention relates to organic lasers which have improved linearity as a function of input power.

BACKGROUND OF THE INVENTION

Vertical cavity surface emitting lasers (VCSELs) based on inorganic semiconductors (e.g. AlGaAs) have been developed since the mid-80's (K. Kinoshita et al., IEEE J. Quant. Electron. QE-23, 882 [1987]). They have reached the point where AlGaAs-based VCSELs emitting at 850 nm are manufactured by a number of companies and have lifetimes beyond 100 years (K. D. Choquette et al., Proc. IEEE 85, 1730 [1997]). With the success of these near-infrared lasers, attention in recent years has turned to other inorganic material systems to produce VCSELs emitting in the visible wavelength range (C. Wilmsen et al., *Vertical-Cavity Surface-Emitting Lasers*, Cambridge University Press, Cambridge, 2001). There are many potential applications for visible lasers, such as, display, optical storage reading/writing, laser printing, and short-haul telecommunications employing plastic optical fibers (T. Ishigure et al., Electron. Lett. 31, 467 [1995]). In spite of the worldwide efforts of many industrial and academic laboratories, much work remains to be done to create viable laser diodes (either edge emitters or VCSELs) that produce light output that spans the visible spectrum.

In an effort to produce visible wavelength VCSELs, it would be advantageous to abandon inorganic-based systems and focus on organic-based laser systems, since organic-based gain materials can enjoy a number of advantages over inorganic-based gain materials in the visible spectrum. For example, typical organic-based gain materials have the properties of low unpumped scattering/absorption losses and high quantum efficiencies. In comparison to inorganic laser systems, organic lasers are relatively inexpensive to manufacture, can be made to emit over the entire visible range, can be scaled to arbitrary size and, most importantly, are able to emit multiple wavelengths (such as red, green, and blue) from a single chip. Over the past number of years, there has been increasing interest in making organic-based solid-state lasers. The laser gain material has been either polymeric or small molecule and a number of different resonant cavity structures were employed, such as, microcavity (Kozlov et al., U.S. Pat. No. 6,160,828), waveguide, ring microlasers, and distributed feedback (see also, for instance, G. Kranzelbinder et al., Rep. Prog. Phys. 63, 729 [2000] and M. Diaz-Garcia et al., U.S. Pat. No. 5,881,083). A problem with all of these structures is that, in order to achieve lasing, it was necessary to excite the cavities by optical pumping using another laser source. It is much preferred to electrically pump the laser cavities since this generally results in more compact and easier to modulate structures.

A main barrier to achieving electrically-pumped organic lasers is the small carrier mobility of organic material, which is typically on the order of $10^{-5}$ $Cm^2/(V\text{-}s)$. This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (V. G. Kozlov et al., J. Appl. Phys. 84, 4096 [1998]). Since electron-hole recombination in organic materials is governed by Langevin recombination (whose rate scales as the carrier mobility), low carrier mobilities result in orders of magnitude more charge carriers than singlet excitons; one of the consequences of this is that charge-induced (polaron) absorption can become a significant loss mechanism (N. Tessler et al., Appl. Phys. Lett. 74, 2764, [1999]). Assuming laser devices have a 5% internal quantum efficiency, using the lowest reported lasing threshold to date of ~100 $W/cm^2$ (M. Berggren et al., Nature 389, 466, [1997]), and ignoring the above mentioned loss mechanisms, would put a lower limit on the electrically-pumped lasing threshold of 1000 $A/cm^2$. Including these loss mechanisms would place the lasing threshold well above 1000 $A/cm^2$, which to date is the highest reported current density, which can be supported by organic devices (N. Tessler, Adv. Mater. 19, 64 [1998]).

An alternative to electrical pumping for organic lasers is optical pumping by incoherent light sources, such as, light emitting diodes (LEDs), either inorganic (M. D. McGehee et al. Appl. Phys. Lett. 72, 1536 [1998]) or organic (Berggren et al., U.S. Pat. No. 5,881,089). This possibility is the result of unpumped organic laser systems having greatly reduced combined scattering and absorption losses (~0.5 $cm^{-1}$) at the lasing wavelength, especially when one employs a host-dopant combination as the active media. Even taking advantage of these small losses, the smallest reported optically-pumped threshold for organic lasers to date is 100 $W/cm^2$ based on a waveguide laser design (M. Berggren et al., Nature 389, 466 [1997]). Since off-the-shelf inorganic LEDs can only provide up to ~20 $W/cm^2$ of power density, a different route must be taken to provide for optically pumping by incoherent sources. In order to lower the lasing threshold additionally, it is necessary to choose a laser structure which minimizes the gain volume; a VCSEL-based microcavity laser satisfies this criterion. Using VCSEL-based organic laser cavities should enable optically-pumped power density thresholds below 5 $W/cm^2$. As a result practical organic laser devices can be driven by optically pumping them with a variety of readily available, incoherent light sources, such as LEDs.

It would be highly desirable to have an organic laser that produces linear laser light output as a function of increased power density. Unfortunately for actual organic-based VCSEL devices, as shown in FIG. 1, the laser light output varies non-linearly with pump-beam power density. The VCSEL laser cavity used to produce the data was composed of a 23 layer bottom dielectric stack of $TiO_2$ and $SiO_2$ (peak reflectivity of 99.3% at 560 nm), a 0.496 $\mu m$ thick periodic gain (Corzine et al. IEEE J. Quant. Electr. 25, 1513 [1989]) active region, and a 29 layer top dielectric stack of $TiO_2$ and $SiO_2$ (peak reflectivity of 99.98% at 560 nm). The periodic gain active region contained two 0.025 $\mu m$ thick layers of aluminum tris(8-hydroxyquinoline) [Alq] doped with 0.5% of [10-(2-benzothiazolyl)-2,3,6,7-tetrahydro-1,1,7,7-tetramethyl-1H,5H,11H-[1]Benzopyrano[6,7,8-ij] quinolizin-11-one] (C545T), separated by layers of 1,1-Bis-(4-bis(4-methyl-phenyl)-amino-phenyl)-cyclohexane (TAPC). The pump-beam was the focused output (1000 mm lens) from a 403 nm 5 mW Nichia laser diode with a repetition rate of 5 KHz and a pulse width of 50 nsec, where its power density was varied by usage of two optical filter wheels. In addition to the saturation of the laser output power, organic VCSEL laser devices also show the undesirable property that the spectral width of the laser emission increases dramatically with pump-beam power density, as opposed to the ideal situation where the linewidth remains relatively invariant with pump-beam power density. This result is illustrated in FIG. 2, where the relative increase in the spectral width of the laser emission is plotted for the device described above. The data in FIG. 2 was obtained by reimaging the laser output (using a 50 mm collecting lens and a 100 mm focusing lens) onto the entrance slit of JY Horiba TE-cooled double monochromator (0.55 m length).

SUMMARY OF THE INVENTION

It is an object of the present invention to provide an organic vertical cavity laser that produces a more linear laser output response and decreases the spectral linewidth broadening problem.

It has been found that by including a thermally conductive layer adjacent to the periodic gain region that the above mentioned difficulties can be significantly reduced.

These objects are achieved by an organic vertical cavity laser device, comprising:

a) a substrate;

b) a bottom dielectric stack reflective to light over a predetermined range of wavelengths and being disposed over the substrate;

c) an organic active region for producing laser light;

d) a top dielectric stack spaced from the bottom dielectric stack and reflective to light over a predetermined range of wavelengths; and e) a thermally conductive transparent layer disposed between the bottom dielectric stack and the organic active region or between the top dielectric stack and the organic active region or both.

Advantages

A feature of the present invention is that by the use of properly positioned thermally conductive transparent layers in organic vertical cavity lasers, significant improvements can be made in the linear laser output response and in reducing the spectral linewidth broadening.

DETAILED DESCRIPTION OF THE INVENTION

Figure 3:
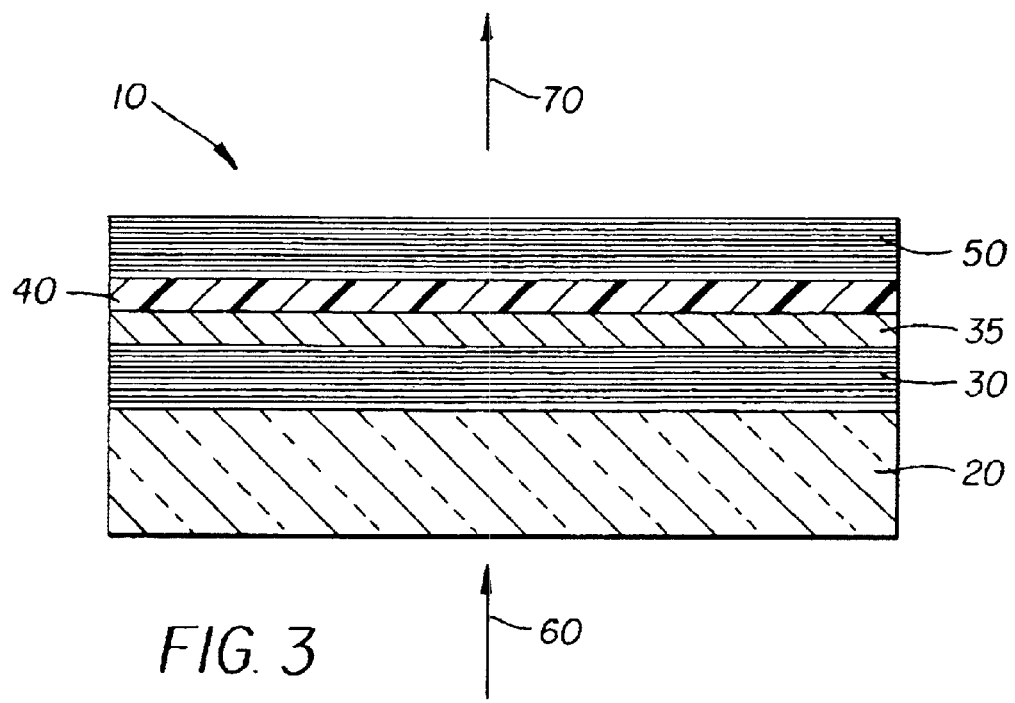
FIG. 3 shows a side-view schematic of an optically pumped organic-based vertical cavity laser according to the present invention.

A schematic of a vertical cavity organic laser device 10 is shown in FIG. 3. The substrate 20 can either be light transmissive or opaque, depending on the intended direction of optical pumping and laser emission. Light transmissive substrates 20 may be transparent glass or plastic. Alternatively, opaque substrates including, but not limited to, semiconductor material (e.g. silicon) or ceramic material may be used in the case where both optical pumping and emission occur through the same surface. On the substrate is deposited a bottom dielectric stack 30 followed by a thermally conductive transparent layer 35. An organic active region 40 is then deposited, followed by a top dielectric stack 50. A pump-beam 60 optically drives the vertical cavity organic laser device 10 through the substrate 20 and the bottom dielectric stack 30 and is mainly absorbed by the organic active region 40. The source of the pump-beam may be incoherent, such as, emission from a light-emitting diode (LED). Alternatively, the pump-beam may originate from a coherent laser source. FIG. 3 shows laser emission 70 from the top dielectric stack 50. Alternatively, the laser structure could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

The bottom and top dielectric stacks 30 and 50 are preferably deposited by conventional electron-beam deposition and are composed of alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack is replaced by the deposition of a reflective metal mirror layer. Typical metals are silver or aluminum, which have reflectivities in excess of 90% in the visible wavelength range. In this alternative embodiment, both the pump-beam 60 and the laser emission 70 would proceed through the substrate 20. Both the bottom dielectric stack 30 and the top dielectric stack 50 are reflective to laser light over a predetermined range of wavelengths. It has been found by experimentation that in order to obtain lasing peaks with full widths at half-maximum (FWHM) less than 1 nm, it is desirable to have the reflectances of both the top and bottom dielectric stacks be greater than ~99% at the laser emission wavelength.

In a first embodiment the thermally conductive transparent layer 35 is positioned in the device 10 adjacent to the organic active region 40 (and the bottom dielectric stack 30) in order to aid in removing unwanted heat generated by optically pumping the laser structure. To enable efficient heat removal, it is preferred that the thermal conductivity of the thermally conductive transparent layer 35 be much greater than the thermal conductivity of the $TiO_2$ and $SiO_2$ bottom and top dielectric stacks 30 and 50 (1–2 W/m-° K), and more preferably greater than 100 W/m-K °. The exact thickness of the layer depends on the refractive index of the material and is approximately 0.2 $\mu$m. Having a layer thickness much greater than 0.2 $\mu$m is undesirable, since it would result in the appearance of additional longitudinal modes in the laser's output power spectrum; whereas, a thinner layer would cause a higher thermal resistance to heat dissipation.

Since the thermally conductive transparent layer 35 is placed inside of the laser cavity, it is preferred that the layer be optically transparent at the wavelengths of the laser emission 70 and the pump-beam 60, in order to avoid unnecessary increases in the lasing threshold. As a result, the absorption coefficient of the thermally conductive transparent layer 35 at the lasing wavelength and at the pump-beam 60 wavelengths should be on the order of 10 $cm^{-1}$ or less.

Two preferred materials to comprise the thermally conductive transparent layer 35 are silicon carbide (SiC) and diamond-like carbon (DLC), since both of them combine good optical transparency in the visible range of the spectrum with very good thermal conductances. Both SiC and DLC may be deposited by plasma enhanced chemical vapor deposition or ion beam assisted sputtering. Silicon carbide deposited by plasma enhanced chemical vapor deposition at a substrate temperature of 350–400° C. has a thermal conductivity of 160W/m-° K (Irace et al. Eurosensors XIII p809 [1999]). DLC films can be deposited by plasma enhanced chemical vapor deposition with substrate temperatures ranging from below 100° C. to over 500° C. The thermal conductivity of the film increases with deposition temperature and is typically 150W/m-° K at a substrate deposition temperature of 100° C. Films deposited in this substrate temperature range are amorphous. Films deposited at higher temperatures, while having higher thermal conductivities, are polycrystalline in structure, thus degrading the optical transparency of the films.

In addition, the thermally conductive transparent layer 35 can also be placed between the organic active region 40 and the top dielectric stack 50. Deposition of layers on top of the organic active region 40 requires low deposition temperatures which cause no damage to the organic active region 40, typically less than 100° C. Even though obtaining high thermal conductance layers typically requires high deposition temperatures (which would result in damaging the organic active region 40), a lower deposition temperature is possible whereby the organic active region 40 remains intact and functional, while enabling a moderate thermal conductance for the thermally conductive transparent layer 35. DLC has been deposited by plasma-enhanced chemical vapor deposition at temperatures as low as 30° C.

Figure 4:
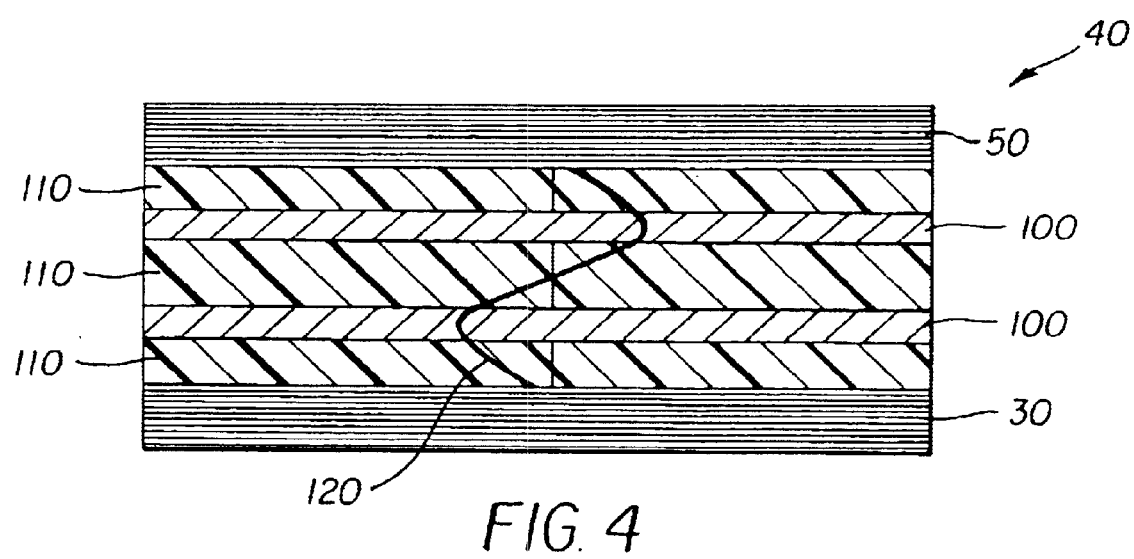
FIG. 4 is a side-view schematic of an optically pumped organic-based vertical cavity laser showing gain region placement within the active region according to the present invention.

FIG. 4 is a side view schematic of the vertical cavity organic laser device 10 with a more detailed view of the organic active region 40. The organic active region 40 includes one or more periodic gain region 100 and spacer layers 110 disposed on either side of the periodic gain regions and arranged so that the periodic gain regions are aligned with the antinodes of the device's standing wave electromagnetic field. This is illustrated in FIG. 4 where the laser's standing electromagnetic field pattern 120 in the active region 40 is schematically drawn. The placement of the gain region(s) is determined by using the standard matrix method of optics (Corzine et al. IEEE J. Quant. Electr. 25, 1513 [1989]). Since stimulated emission is highest at the antinodes and negligible at the nodes of the electromagnetic field, it is inherently advantageous to form the active region 40 as shown in FIG. 4. The spacer layers 110 do not undergo stimulated or spontaneous emission and largely do not absorb either the laser emission 70 or the pump-beam 60 wavelengths. An example of a spacer layer 110 is the organic material TAPC. TAPC works well as the spacer material since it largely does not absorb either the laser output or the pump-beam and, in addition, its refractive index is slightly lower than that of most organic host materials. This refractive index difference is useful since it helps in maximizing the overlap between the electromagnetic field antinodes and the periodic gain region(s) 100.

In a second embodiment the organic material of the spacer layers is replaced by a thermally conductive material such as SiC or DLC. As discussed above, these layers are substantially transparent to both the laser emission 70 and the pump-beam 60 wavelengths. In addition, their high thermal conductivities aid in extracting the excess heat from the periodic gain regions 100. In fact, having the spacer layers composed of thermally conductive transparent media is highly desirable, since otherwise the heat would have to first pass through poor thermal conductors, such as, TAPC, before reaching the thermally conductive transparent layer 35 adjacent to the active region as in the first embodiment as shown in FIG. 3. As a result of using SiC, DLC, or some other thermally conductive transparent media as the spacer layer material, the heat generated in the periodic gain region 100 is more quickly dissipated, which should help produce more linear laser light output responses and minimize the degree of spectral broadening of the laser linewidth.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino,p-dodecylphenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyl-tetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]-sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected. Substitution can include fused ring derivatives such as, but not limited to benzo-, dibenzo-, naphtha-, or dinaphtho-fused derivatives. These fused ring derivatives can be further substituted as well.

The emissive material, or periodic gain region(s) 100, can be comprised of a single host material, but more commonly consists of a host material doped with a guest compound (dopant) or compounds where light emission comes primarily from the dopant and can be of any color. These host-dopant combinations are advantageous since they result in very small unpumped scattering/absorption losses for the gain media (can be less than 1 $cm^{-1}$). The dopant is usually chosen from highly fluorescent dyes, but phosphorescent compounds, e.g., transition metal complexes as described for OLED applications in WO 98/55561, WO 00/18851, WO 00/57676, and WO 00/70655 are also useful. Dopants are typically coated as 0.01 to 10% by weight into the host material, wherein they can be selected to provide emitted light having hues of either red, green, or blue. An example of a useful host-dopant combination for red emitting layers is Alq as the host material and 1% L39 [4-(dicyanomethylene)-2-t-butyl-6-(1,1,7,7-tetramethyljulolidyl-9-enyl)-4H-pyran] as the dopant.

An important relationship for choosing a dye as a dopant is a comparison of the absorption of the dopant material and emission of the host material. For efficient energy transfer (via Forster energy transfer) from the host to the dopant molecule, a necessary condition is that the absorption of the dopant overlaps the emission of the host material. Those skilled in the art are familiar with the concept of Forster energy transfer, which involves a radiationless transfer of energy between the host and dopant molecules. An important relationship for choosing the host material is that the absorption of the host material significantly overlaps the emission spectrum of the pump-beam 60 light. In addition it is preferred that the absorption of the host material or a host material plus a dopant is small at the laser emission wavelength of the device 10. An acceptable level of absorption is that the absorption coefficient of the host plus dopant combination is less than 10 $cm^{-1}$ at the wavelength of the laser emission.

Useful fluorescent emissive materials includes polycyclic aromatic compounds as described in I. B. Berlman, "Handbook of Fluorescence Spectra of Aromatic Molecules," Academic Press, New York, 1971 and EP 1009 041. Tertiary aromatic amines with more than two amine groups may be used including oligomeric materials.

Another class of useful emissive materials (for host or dopants) include aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or an oligomeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

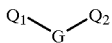

A wherein:
Q₁ and Q₂ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

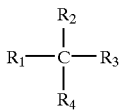

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

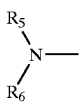

C wherein $R_5$ and $R_6$ are independently selected aryl groups. In one embodiment, at least one of $R_5$ or $R_6$ contains a polycyclic fused ring structure, e.g., a naphthalene.

The host material can comprise a substituted or unsubstituted triarylamine compound. Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

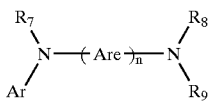

D wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The emissive material can be formed of a single or a mixture of aromatic tertiary amine compounds. Specifically, one may employ a triarylamine, such as a triarylamine satisfying the Formula B, in combination with a tetraaryldiamine, such as indicated by Formula D. The host material can include a substituted or unsubstituted dicarbazole-biphenyl compound. Illustrative of useful aromatic tertiary amines is the following:

4,4'-N,N'-dicarbazole-1,1'-biphenyl (CBP) (D1)
4,4'-Bis[N-(1-naphthyl)-N-phenylamino]biphenyl (D2)
4,4'-Bis[N-(1-naphthyl)-N-(2-naphthyl)amino]biphenyl (D3)
4,4'-Bis[N-(2-naphthyl)-N-p-tolylamino]biphenyl (D4)
1,1-Bis(4-di-p-tolylaminophenyl)cyclohexane
1,1-Bis(4-di-p-tolylaminophenyl)-4phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}-biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine.

The host material can comprise a substituted or unsubstituted aza-aromatic compound. For example, the host material can comprise a substituted or unsubstituted acridine, quinoline, purine, phenazine, phenoxazine, or phenanthroline compound. Carbazole derivatives are useful hosts. Useful examples of phenanthroline materials include 2,9-dimethyl-4,7-diphenyl-1,10-phenanthroline and 4,7-diphenyl-1,10-phenanthroline.

Host and dopant molecules include, but are not limited to, those disclosed in U.S. Pat. Nos. 4,768,292; 5,141,671;

5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

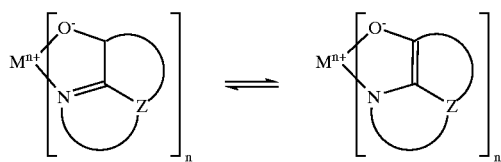

wherein:

M represents a metal;

n is an integer of from 1 to 3; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material can comprise a substituted or unsubstituted chelated oxinoid compound.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

The host material can include a substituted or unsubstituted anthracene compound.

Derivatives of 9,10-di-(2-naphthyl)anthracene (Formula F) constitute one class of useful hosts capable of supporting photoluminescence, and are particularly suitable for light emission of wavelengths longer than 400 nm, e.g., blue, green, yellow, orange or red.

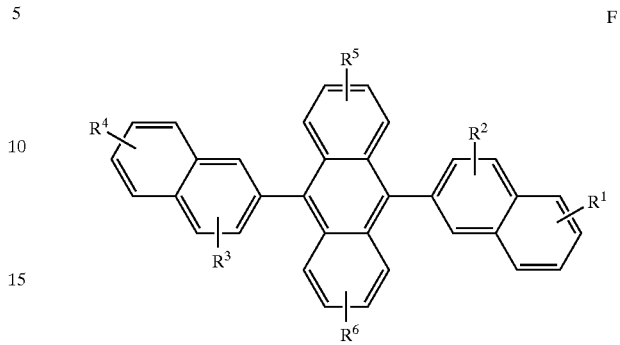

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl) anthracene (F1) and 2-t-butyl-9,10-di-(2-naphthyl) anthracene (F2). Other anthracene derivatives can be useful as a host, including derivatives of 9,10-bis-(4-(2,2'-diphenylethenyl)phenyl)anthracene.

Benzazole derivatives (Formula G) constitute another class of useful hosts capable of supporting photoluminescence, and are particularly suitable for light emission of wavelengths longer than 400 nm, e.g., blue, green, yellow, orange or red.

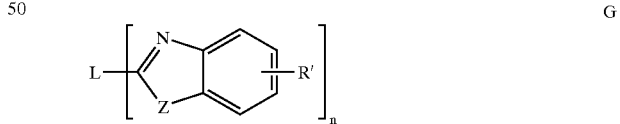

where:

n is an integer of 3 to 8;

Z is O, NR or S; and

R and R'are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together. An example of a useful benzazole is 2, 2', 2"-(1,3,5-phenylene) tris[1-phenyl-1H-benzimidazole].

The host material can comprise a substituted or unsubstituted benzoxazole compound, a substituted or unsubstituted benzthiazole compound, or a substituted or unsubstituted benzimidazole compound. The host material can comprise a substituted or unsubstituted oxazole compound, a substituted or unsubstituted triazole compound, or a substituted or unsubstituted oxadiazole compound. Useful examples of oxazole compounds include 1,4-bis(5-phenyloxazol-2-yl)benzene, 1,4-bis(4-methyl-5-phenyloxazol-2-yl)benzene, and 1,4-bis(5-(p-biphenyl) oxazol-2-yl)benzene. Useful examples of oxadiazole compounds include 2-(4-biphenylyl)-5-phenyl-1,3,4-oxadiazole and 2-(4-biphenylyl)-5-(4-tert-butylphenyl)-1,3, 4-oxadiazole. Useful examples of triazole compounds include 3-(4-biphenylyl)-4-phenyl-5-tert-butylphenyl-1,2,4-triazole.

Distyrylarylene derivatives are also useful as host materials or dopant materials, many examples are described in U.S. Pat. No. 5,121,029. Useful emissive materials (hosts and dopants) can have the general Formulae (H) or (I):

X—CH=CH—Y—CH=CH-Z          (H)

X—(CH=CH)$_n$-Z          (I)

where:
X and Z are independently a substituted or unsubstituted aromatic group or a substituted or unsubstituted aromatic complex ring group having one nitrogen atom;
n equals 1, 2, or 3; and
Y is a divalent aromatic group or a divalent aromatic complex ring group having one nitrogen atom. Useful examples include, 1,4-bis(2-methylstyryl)-benzene, 4,4'-(9,10-anthracenediyldi-2,1-ethenediyl)bis(N,N-bis (4-methylphenyl)-benzenamine, 4,4'-(1,4-naphthalenediyldi-2,1-ethenediyl)bis(N,N-bis(4-methylphenyl)benzenamine, and 4,4'-(1,4-phenylenedi-2,1-ethenediyl)bis(N,N-(4-tolyl)) benzeneamine.

The dopant is selected to provide emission between 300–1700 nm. The dopant can be selected from fluorescent or phosphorescent dyes. Useful fluorescent dopants include materials as described as host materials above. Other useful fluorescent dopants include, but are not limited to, derivatives of substituted or unsubstituted anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, napthyridine, fluoranthene, furan, indole, thiaphene, benzoxanthene, pyrene, peropyrene, terphenyl, quaterphenyl, quinquephenyl, sexiphenyl, anthanthrene, bisanthrene compounds, N,N,N',N'-tetrasubstituted benzidene derivatives, N,N,N',N'-tetrarylbenzidene derivatives and carbostyryl compounds or combinations thereof. Derivatives of these classes of materials can also serve as useful host materials or combinations thereof. Host materials will often be compounds containing at least three phenylene moieties.

Illustrative examples of useful dopants include, but are not limited to, the following:

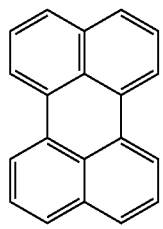

L1

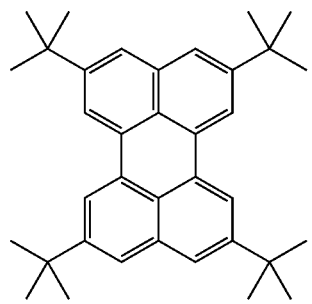

L2

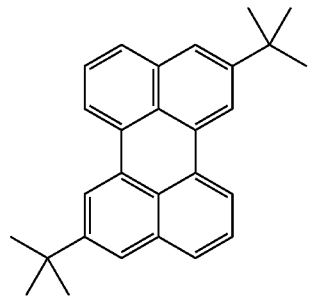

L3

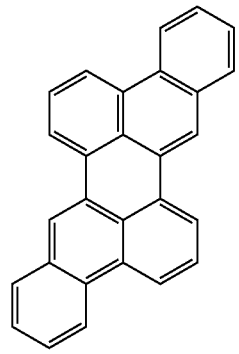

L4

-continued
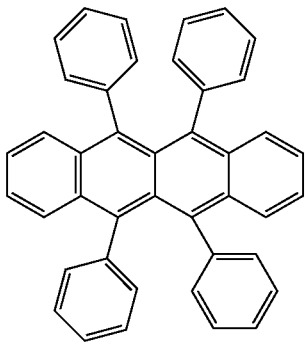
L5
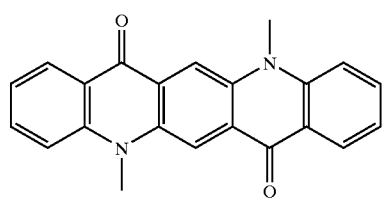
L6
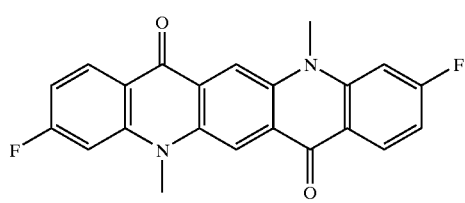
L7
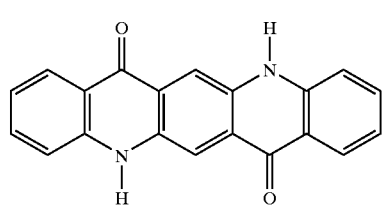
L8
-continued
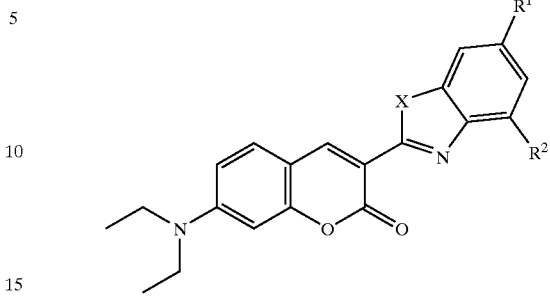
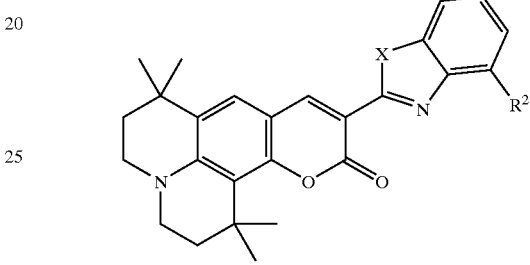
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued
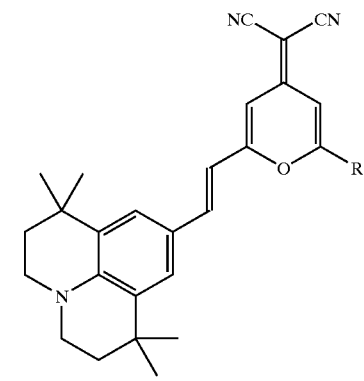
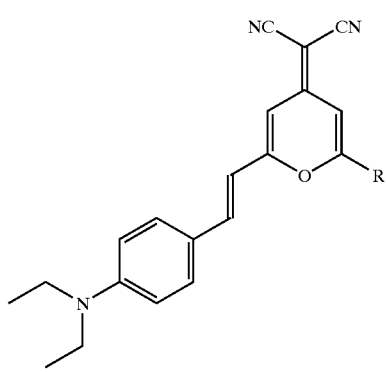
| | R |
|---|---|
| L37 | phenyl |
| L38 | methyl |
| L39 | t-butyl |
| L40 | mesityl |
| L41 | phenyl |
| L42 | methyl |
| L43 | t-butyl |
| L44 | mesityl |
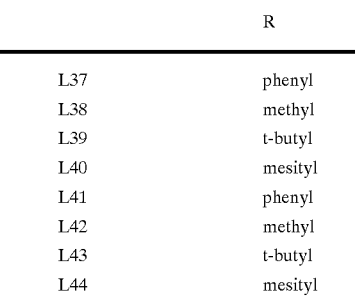
L45
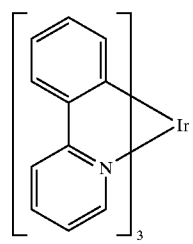
L46
-continued
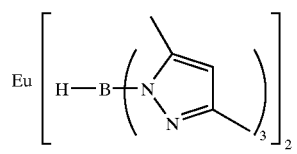
L47
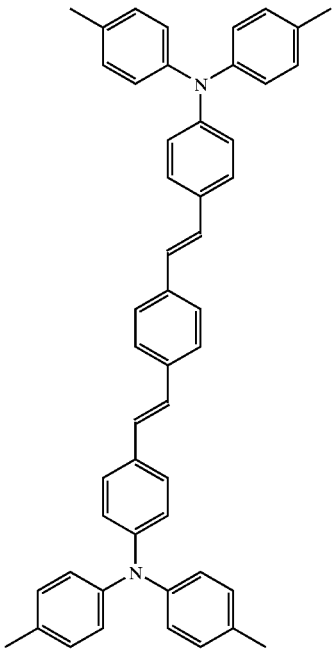
L48
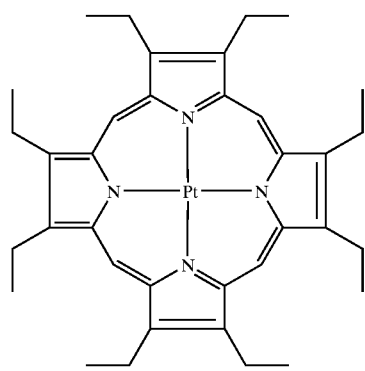
L49

-continued
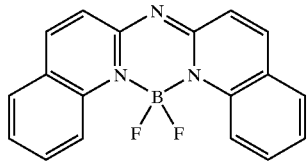
L50
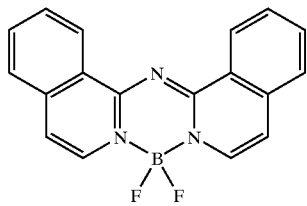
L51
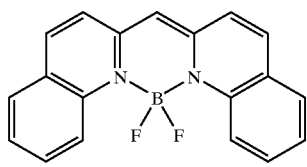
L52
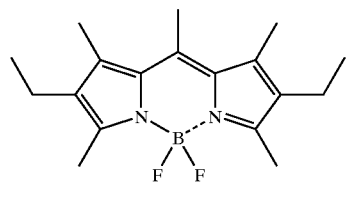
L53
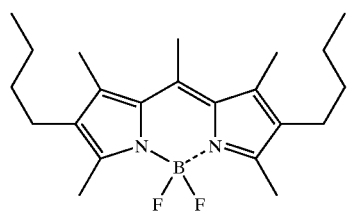
L54
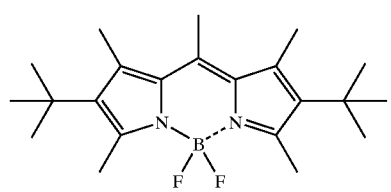
L55
-continued
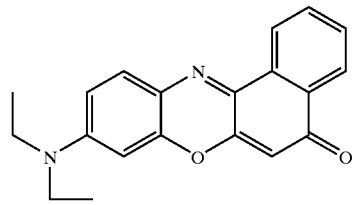
L56
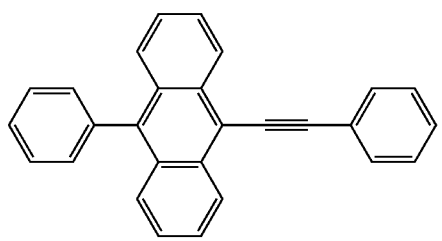
L57
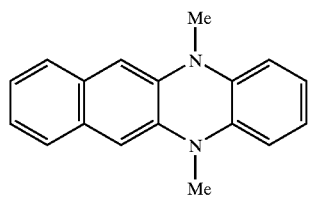
L58
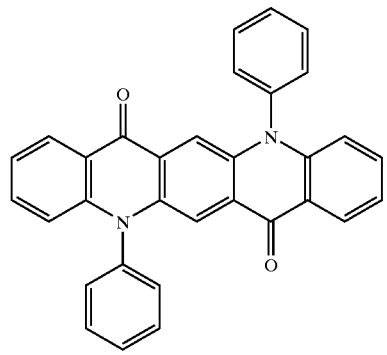
L59
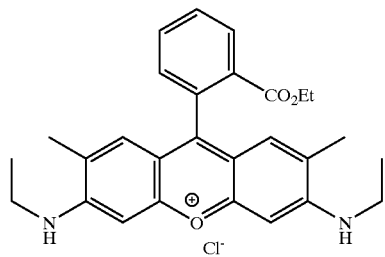
L60

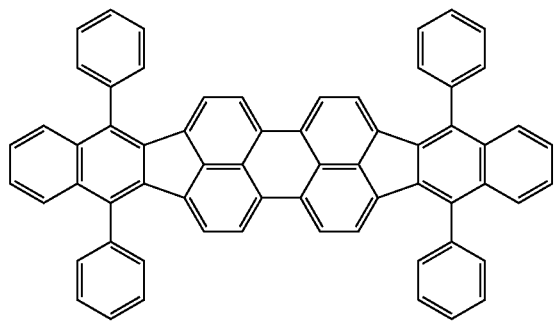

L61

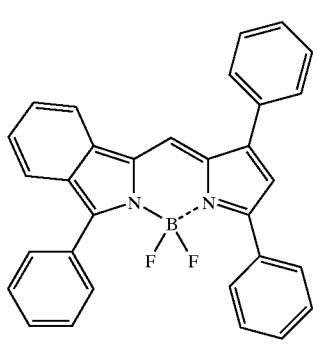

L62

Other emissive materials include various heterocyclic optical brighteners as described in U.S. Pat. No. 4,539,507.

The emissive material can also be a polymeric material, a blend of two or more polymeric materials, or a doped polymer or polymer blend. The emissive material can also be a combination of more than one nonpolymeric and polymeric materials with or without dopants. Typical dopants are listed previously for nonpolymeric molecules. Nonpolymeric dopants can be molecularly dispersed into the polymeric host, or the dopant could be added by copolymerizing a minor constituent into the host polymer. Typical polymeric materials include, but are not limited to, substituted and unsubstituted poly(p-phenylenevinylene) (PPV) derivatives, substituted and unsubstituted poly(p-phenylene) (PPP) derivatives, substituted and unsubstituted polyfluorene (PF) derivatives, substituted and unsubstituted poly(p-pyridine), substituted and unsubstituted poly(p-pyridalvinylene) derivatives, and substituted, unsubstituted poly(p-phenylene) ladder and step-ladder polymers, and copolymers thereof as taught by Diaz-Garcia et al. in U.S. Pat. No. 5,881,083 and references therein. The substituents include but are not limited to alkyls, cycloalkyls, alkenyls, aryls, heteroaryls, alkoxy, aryloxys, amino, nitro, thio, halo, hydroxy, and cyano. Typical polymers are poly(p-phenylene vinylene), dialkyl-, diaryl-, diamino-, or dialkoxy-substituted PPV, mono alkyl-mono alkoxy-substituted PPV, mono aryl-substituted PPV, 9,9'-dialkyl or diaryl-substituted PF, 9,9'-mono alky-mono aryl substituted PF, 9-mono alky or aryl substituted PF, PPP, dialkyl-, diamino-, diaryl-, or dialkoxy-substituted PPP, mono alkyl-, aryl-, alkoxy-, or amino-substituted PPP. In addition, polymeric materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Useful spacer materials are those that have insignificant absorption at or above the emission of the pump-beam 60 light. Besides TAPC previously mentioned, other useful materials include 1,2,3,4-tetraphenylnaphthalene, mono-, 1,3-di-, 1,3,5-tri-, and 1,3,5,7-tetraaryladamantanes, tetraarylmethanes and triptycenes or combinations thereof.

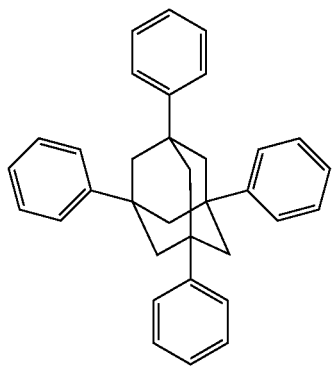

SO1

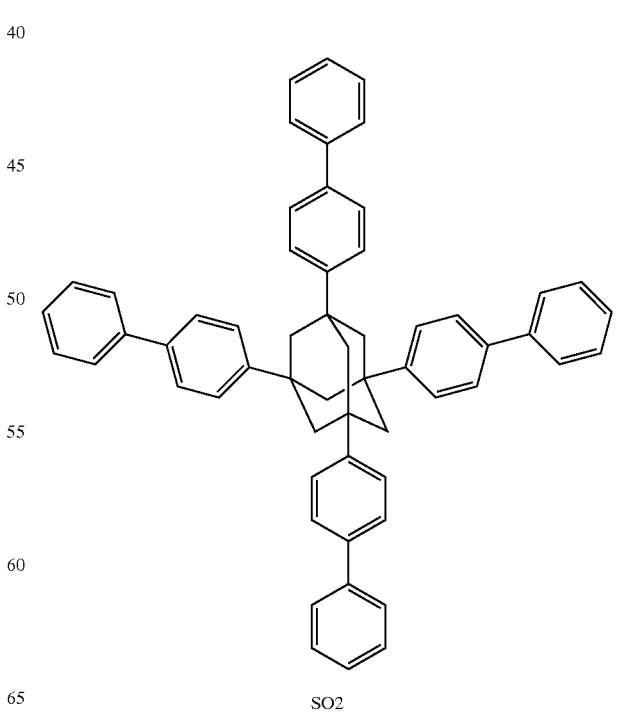

SO2

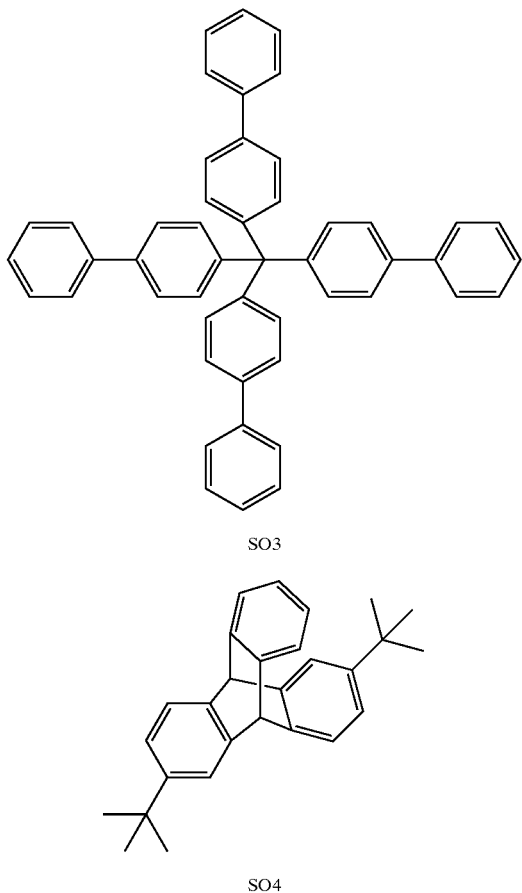

SO3

SO4

The spacer material can also include substituted or unsubstituted 1,2,3,4-tetraphenylnaphthalene, 1,3,5-tri(3,5-dimethylphenyl)adamantane, 1,3,5,7-tetra(4-biphenyl)adamantane, 1,1-Bis-(4-bis(4-methyl-phenyl)-aminophenyl)-cyclohexane, tetra(4-biphenyl)methane, or 2-t-butyl-9,10-o-benzeno-9,10-dihydroanthracene or combinations thereof.

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most organic laser devices are sensitive to moisture or oxygen, or both, so they are commonly sealed in an inert atmosphere such as nitrogen or argon. Desiccant such as alumina, bauxite, calcium sulfate, clays, silica gel, zeolites, alkaline metal oxides, alkaline earth metal oxides, sulfates, or metal halides and perchlorates can be incorporated into the sealed device. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Figure 5:
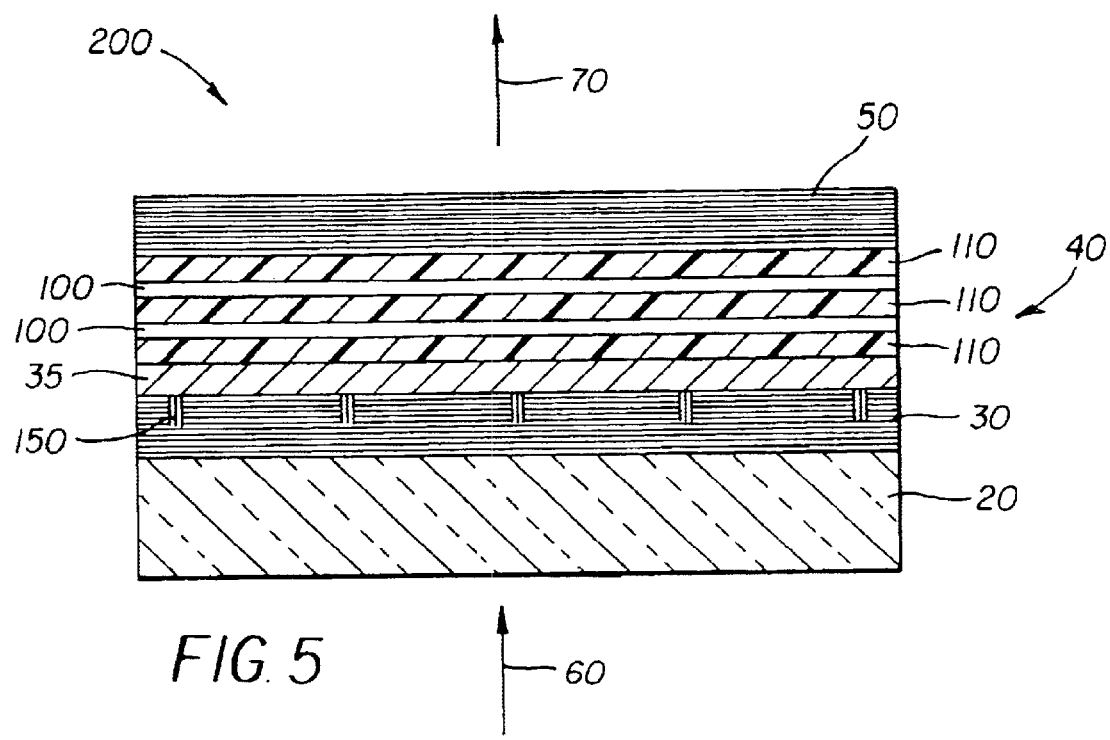
FIG. 5 shows a side-view schematic of an optically pumped two-dimensional phase-locked organic vertical cavity laser array made in accordance with the present invention.

An additional embodiment of the present invention is given in FIG. 5 that shows a two-dimensional phase-locked laser array device 200. This device enables single mode lasing action for large area laser structures. On the substrate 20 is deposited a bottom dielectric stack 30 followed by a thermally conductive transparent layer 35. An organic active region 40 is then deposited, followed by a top dielectric stack 50. Analogous to the design for laser device 10, the organic active region 40 includes one or more periodic gain region 100 and organic spacer layers 110 disposed on either side of the periodic gain regions and arranged so that the periodic gain regions are aligned with the antinodes of the device's standing wave electromagnetic field. The compositions and spectral reflectances of the bottom 30 and top 50 dielectric stacks are also analogous to those employed in laser device 10.

Figure 6:
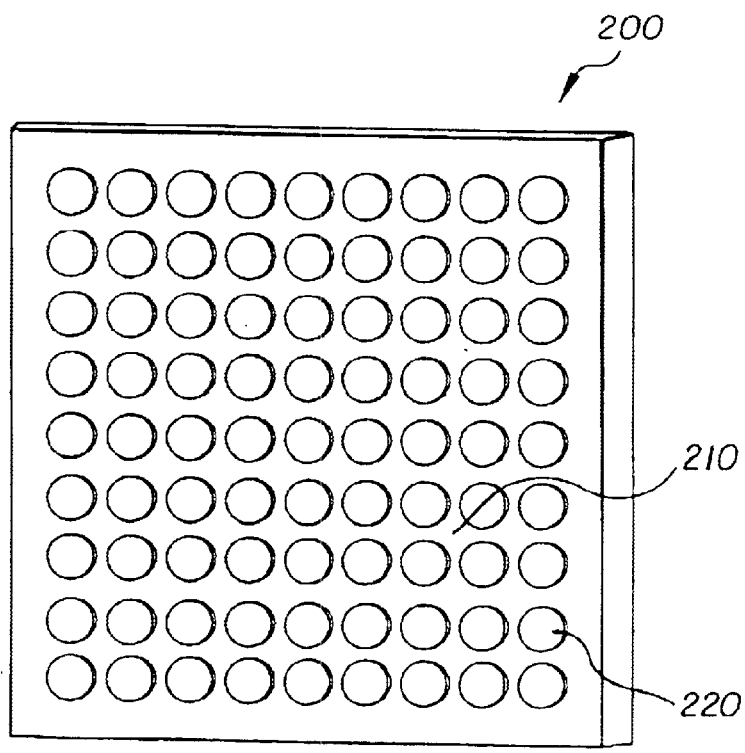
FIG. 6 shows a top-view schematic of an optically pumped two-dimensional phase-locked organic vertical cavity laser array made in accordance with the present invention.

As shown in FIG. 6, in order to form a two-dimensional phase-locked laser array 200, on the surface of the VCSEL needs to be defined lasing pixels 220 separated by interpixel regions 210. To obtain phase locking, intensity and phase information must be exchanged amongst the pixels. Phase-locking is advantageous for inorganic lasers by modulating the reflectance of the top dielectric stack by either adding metal (E. Kapon and M. Orenstein, U.S. Pat. No. 5,086,430) or by deep etching into the top dielectric stack (P. L. Gourley et al., Appl. Phys. Lett. 58, 890 [1991]). In both inorganic laser array cases, the laser pixels were on the order of 3–5 $\mu$m wide (so as to enable single mode action) and the interpixel spacing was 1–2 $\mu$m. Applying these results to organic laser systems requires some care, since it is very difficult to perform micron-scale patterning on the laser structure once the organic layers have been deposited. As a result, in the preferred embodiment the reflectance modulation was affected by patterning and forming an etched region 150 in the bottom dielectric stack 30, using standard photolithographic and etching techniques, thus forming a two-dimensional array of circular pillars on the surface of the bottom dielectric stack 30. In the preferred embodiment the shape of the laser pixels is circular; however, other pixel shapes are possible, such as, rectangular. The interpixel spacing is in the range of 0.25 to 4 $\mu$m. Phase-locked array operation also occurs for larger interpixel spacings; however, it leads to inefficient usage of the optical-pumping energy. Following the inorganic lead and etching deeply into the bottom dielectric stack 30 in order to significantly lower the interpixel reflectivity is not a preferred route since it would lead to significant modulation of the active region position. A preferred method is to make a shallow etch from 50 to 550 nm deep to form etched region 150, and make use of the condition that lasing only occurs for wavelengths whose round-trip phase is an integer multiple of 2$\pi$. As an example for red laser arrays, the lasing wavelength was chosen to be 660 nm. By removing odd multiples of layers (e.g., one $SiO_2$ layers or 2 $SiO_2$ layers and a $TiO_2$ layer) from the bottom dielectric stack 30, it was calculated (S. W. Corzine et al., IEEE J. Quant. Electron. 25, 1513 [1989]) that the lasing wavelength in the interpixel region 210 would be pushed as far as possible from 660 nm (~610 and 710 nm). In doing this it was found that the lasing and spontaneous emission signals in the 710 nm region are very small. Further, it was determined that by etching a few tens of nanometers deeper into the next $TiO_2$ layer, the short wavelength resonance condition would be pushed into the 590 nm wavelength region. In this wavelength region the dielectric stack reflectivity is significantly lower (which would impede any unwanted lasing) and the gain media's fluorescence strength is much reduced (which would impede any unwanted spontaneous emission). Hence, lasing action is prevented and spontaneous emission is significantly reduced in the interpixel region 210 by etching just beyond a couple of odd multiples of layers into the bottom dielectric stack 30. The end result of the formation of etched region 150 is that the laser emission is weakly confined to the laser pixels 220, no lasing originates from the interpixel regions 210, and coherent phase-locked laser light is emitted by the array 200.

The laser pixels 220 in FIG. 6 are arranged in a square two-dimensional array, which under phase-locked operation results in each element being 180 degrees out of phase with its four nearest neighbors (E. Kapon and M. Orenstein, U.S. Pat. No. 5,086,430). Other arrangements of the laser pixels 220 are allowed, such as, linear arrays or other two-dimensional periodic arrangements of the pixels. However, as shown by Kapon et al. (U.S. Pat. No. 5,086,430), close-packed two-dimensional arrangements (such as a hexagonal lattice array) result in more complicated phase relationships between the neighboring pixels.

Similar to the first embodiment the thermally conductive transparent layer 35 is positioned in the two-dimensional phase-locked laser array 200 adjacent to the organic active region 40 (and the bottom dielectric stack 30) in order to aid in removing unwanted heat generated by optically pumping the laser structure. To enable efficient heat removal, it is preferred that the thermal conductivity of the thermally conductive transparent layer 35 be much greater than the thermal conductivity of the $TiO_2$ and $SiO_2$ bottom and top dielectric stacks 30 and 50 (1–2 W/m-° K) and preferably greater than 100 W/m-K °. The exact thickness of the layer depends on the refractive index of the material and is approximately 0.2 $\mu$m. Having a layer thickness much greater than 0.2 $\mu$m is undesirable, since it would result in the appearance of additional longitudinal modes in the laser's output power spectrum, whereas a thinner layer would cause a higher thermal resistance to heat dissipation.

Since the thermally conductive transparent layer 35 is placed inside of the laser cavity, it is preferred that the layer be optically transparent at the wavelengths of the laser emission 70 and the pump-beam 60, in order to avoid unnecessary increases in the lasing threshold. As a result, the absorption coefficient of the thermally conductive transparent layer 35 at the lasing wavelength and at the pump-beam 60 wavelengths should be on the order of 10 $cm^{-1}$ or less.

Two preferred materials to comprise the thermally conductive transparent layer 35 are SiC and DLC, since both of them combine good optical transparency in the visible spectrum with very good thermal conductances. Both SiC and DLC may be deposited by plasma enhanced chemical vapor deposition or ion beam assisted sputtering. Silicon carbide deposited by plasma enhanced chemical vapor deposition at a substrate temperature of 350–400° C. has a thermal conductivity of 160 W/m-° K (Irace et al. Eurosensors XIII p809 [1999]). DLC films can be deposited by plasma enhanced chemical vapor deposition with substrate temperatures ranging from below 100° C. to over 500° C. The thermal conductivity of the film increases with deposition temperature and is typically 150 W/m-° K at a substrate deposition temperature of 100° C. Films deposited in this substrate temperature range are amorphous. Films deposited at higher temperatures, while having higher thermal conductivities, are polycrystalline in structure, thus degrading the optical transparency of the film.

In addition, the thermally conductive transparent layer 35 can also be placed between the organic active region 40 and the top dielectric stack 50. Deposition of layers on top of the organic active region 40 requires low deposition temperatures which cause no damage to the organic active region 40, typically less than 100° C. Even though obtaining high thermal conductance layers typically requires high deposition temperatures (which would result in damaging the organic active region 40), a lower deposition temperature is possible whereby the organic active region 40 remains intact and functional, while enabling a moderate thermal conductance for the thermally conductive transparent layer 35. We have deposited DLC by plasma enhanced chemical vapor deposition at temperatures as low as 30° C.

As in the second embodiment above, the organic material of the spacer layers 110 are replaced by a thermally conductive material, such as, SiC or DLC. As discussed above, these layers are substantially transparent to both the laser emission 70 and the pump-beam 60 wavelengths. In addition, their high thermal conductivities aid in extracting the excess heat from the periodic gain regions 100. In fact, having the spacer layers composed of thermally conductive transparent media is highly desirable, since otherwise the heat would have to first pass through organic spacer layers that are poor thermal conductors, such as TAPC, before reaching the thermally conductive transparent layer 35 adjacent to the active region as in the first embodiment as shown in FIG. 3. As a result of using SiC, DLC, or some other thermally conductive transparent media as the spacer layer material, the heat generated in the periodic gain region 100 is more quickly dissipated, which should help produce more linear laser light output responses and minimize the degree of spectral broadening of the laser linewidth.

The two-dimensional phase-locked laser array device 200 is optically driven by an incident pump-beam source 60 and emits phase-locked laser emission 70. Depending on the lasing power density threshold of the organic laser cavity, the pump-beam can be either focused laser light or incoherent LED light. FIG. 5 shows laser emission 70 through the top dielectric stack 50. Alternatively, the laser structure could be optically pumped through the top dielectric stack 50 with the laser emission through the substrate 20 by proper design of the dielectric stack reflectance properties. In the case of an opaque (e.g., silicon) substrate, both optical pumping and laser emission occurs through the top dielectric stack 50. The operation of the optically-pumped organic laser array device occurs by the following means. The pump-beam 60 transmits through the substrate 20 and the bottom dielectric stack 30, and is absorbed by the periodic gain region(s) 100, wherein some fraction of the pump-beam energy is re-emitted as longer wavelength laser light. When the pump-beam 60 enters through the substrate 20, to ensure that the laser output 70 mainly exits through the top dielectric stack 50, it is necessary to choose the bottom dielectric stack 30 peak reflectance to be greater than the top dielectric stack 50 peak reflectance. To improve the power conversion efficiency of the device, it is common practice to add additional dielectric layers to both dielectric stacks, such that, the bottom dielectric stack 30 is highly transmissive to the pump-beam 60 and the top dielectric stack 50 is highly reflective to the pump-beam 60. The laser light 70 is emitted by the laser pixels 220 and as a result of the weak confinement, both phase and intensity information is exchanged amongst the pixels. As a result, coherent phase-locked laser emission occurs through the top dielectric stack 50.

In an alternative embodiment of the present invention, the top dielectric stack 50 is replaced by the deposition of a reflective metal mirror layer. Typical metals are silver or aluminum, which have reflectivities in excess of 90%. It is preferred that the metals be deposited by vacuum thermal evaporation to avoid causing damage to the underlying organic layers. In this alternative embodiment, both the pump-beam 60 and the laser emission 70 would proceed through the substrate 20.

The following example is presented as further understandings of the present invention and is not to be construed as limitations thereon.

EXAMPLE 1

In order to determine the impact on the lasing characteristics of placing a thermally conductive layer adjacent to the organic active region 40, a laser device 10 was fabricated where the top dielectric stack 50 was replaced by a Ag mirror. The laser structure was deposited on a pre-cleaned 6-inch quartz substrate 20. Over the substrate 20 was deposited by conventional electron-beam deposition at 240° C. the bottom dielectric stack 30, which was composed of alternating high and low refractive index layers of $TiO_2$ and $SiO_2$, respectively. The resulting dielectric mirror had a measured peak reflectance of ~99.3% at 560 nm. On top of the bottom dielectric stack 30 was deposited, by high vacuum thermal evaporation, the organic active region 40, where in order was grown 149 nm of TAPC, 30 nm of Alq with 0.5% C545T, and 207 nm of TAPC. Lastly, a 200 nm thick Ag metal mirror was deposited by high vacuum thermal evaporation.

Since the top dielectric stack 50 was replaced by a Ag mirror, both the pump-beam 60 and the laser emission 70 proceeded through the quartz substrate 20. To test the device for both its spectral and power characteristics, the laser cavity was optically pumped from the substrate side at approximately 30° from the normal using the 403 nm output from a 5 mW Nichia laser diode. The pump laser produced 50 nsec laser pulses at a repetition rate of 5 KHz. The pump-beam intensity was adjusted by the combination of two neutral density wheels and it was focused onto the laser cavity surface using a 1000 mm lens. The resulting measured pump-beam spot size on the device surface was elliptical with dimensions of 177×243 μm. The laser output 70 from the cavity was focused on the entrance slit of a JY-Horiba double monochrometer (0.55 m) by the combination of a 50 mm f2 lens and a 100 mm f4 lens nearest the slit (resulting in a 2× magnification of the laser's near-field image). The resolution of the monochromator is approximately 0.08 nm; its output was detected by a cooled Hamamatsu photomultiplier tube.

Figure 1:
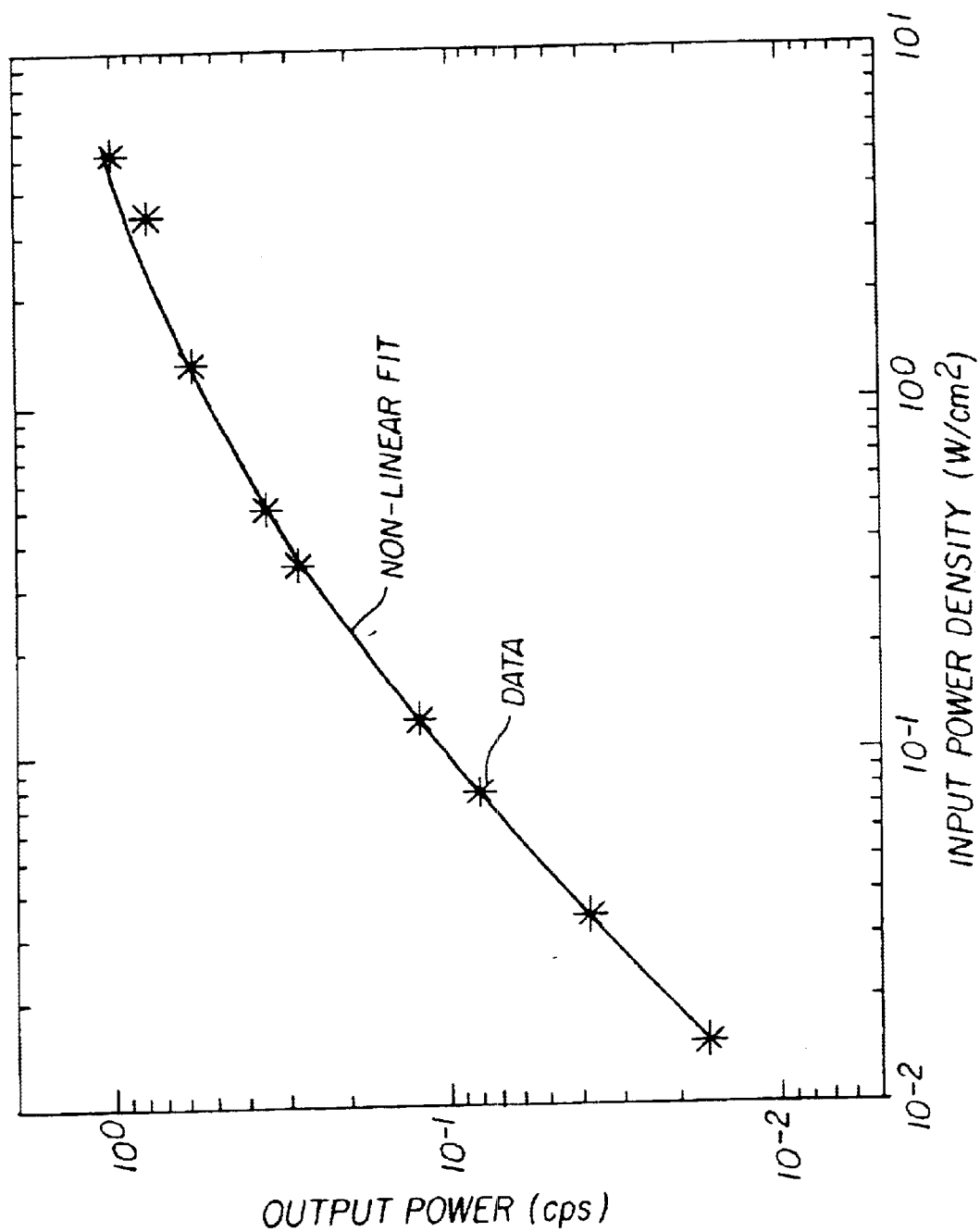
FIG. 1 is graph which depicts the laser optical output power vs. input power for a prior art organic vertical cavity laser device.
Figure 7:
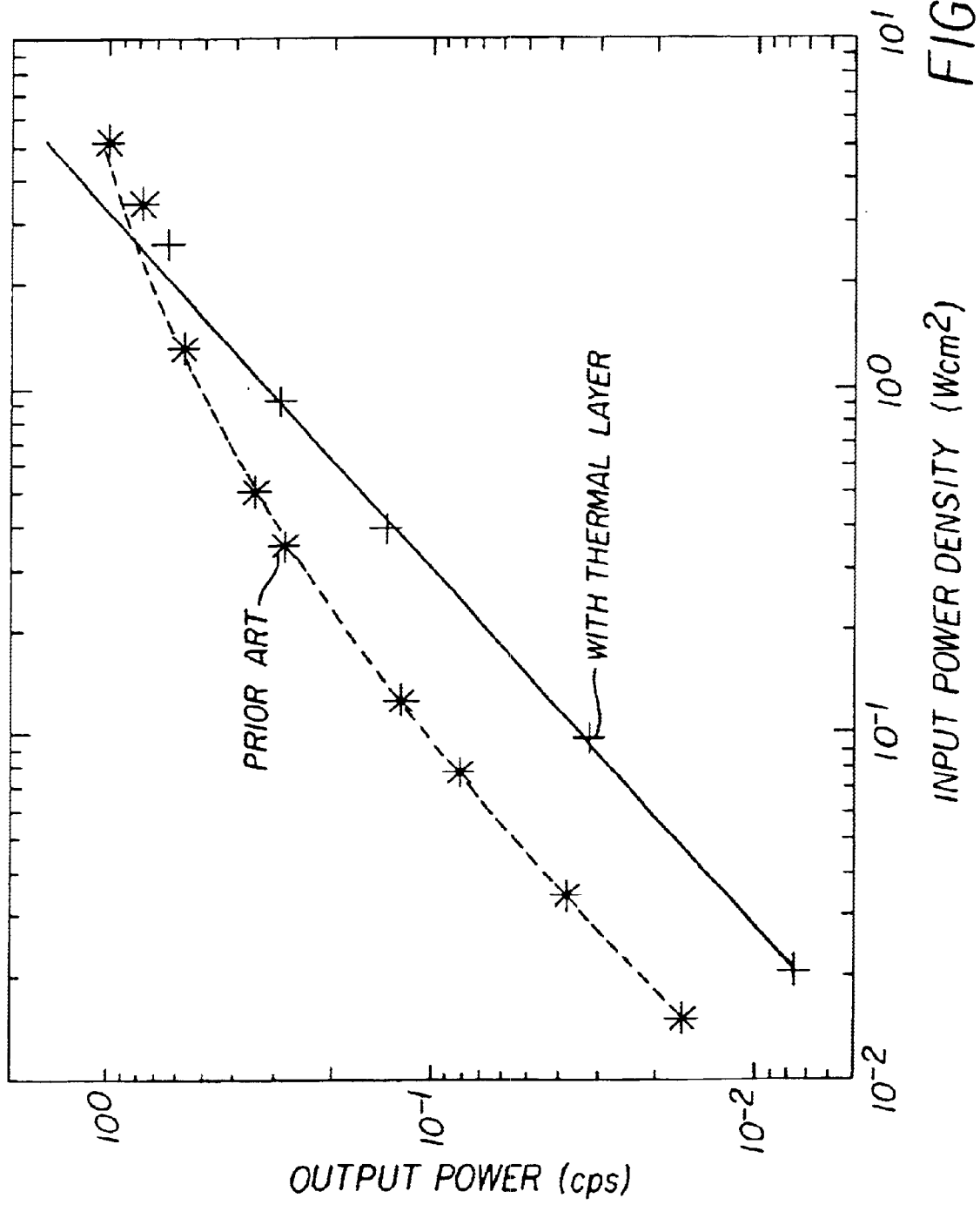
FIG. 7 is graph which depicts the laser optical output power vs. input power for a prior art organic vertical cavity laser device and for a device made in accordance with the present invention.

FIG. 7 shows the output laser power of the laser device with a top Ag mirror as a function of the pump-beam power density. In addition, the figure also contains the power characteristics of a prior art device (previously shown in FIG. 1) where no thermally conductive layer is placed adjacent to the organic active region 40. As the figure shows, the device with a thermally conductive layer (Ag mirror) placed near the organic active region 40 results in a linear output power response up to a pump-beam power density of ~2 $W/cm^2$. On the other hand, the output power response of the prior art device is non-linear for all pump-beam power densities.

Figure 2:
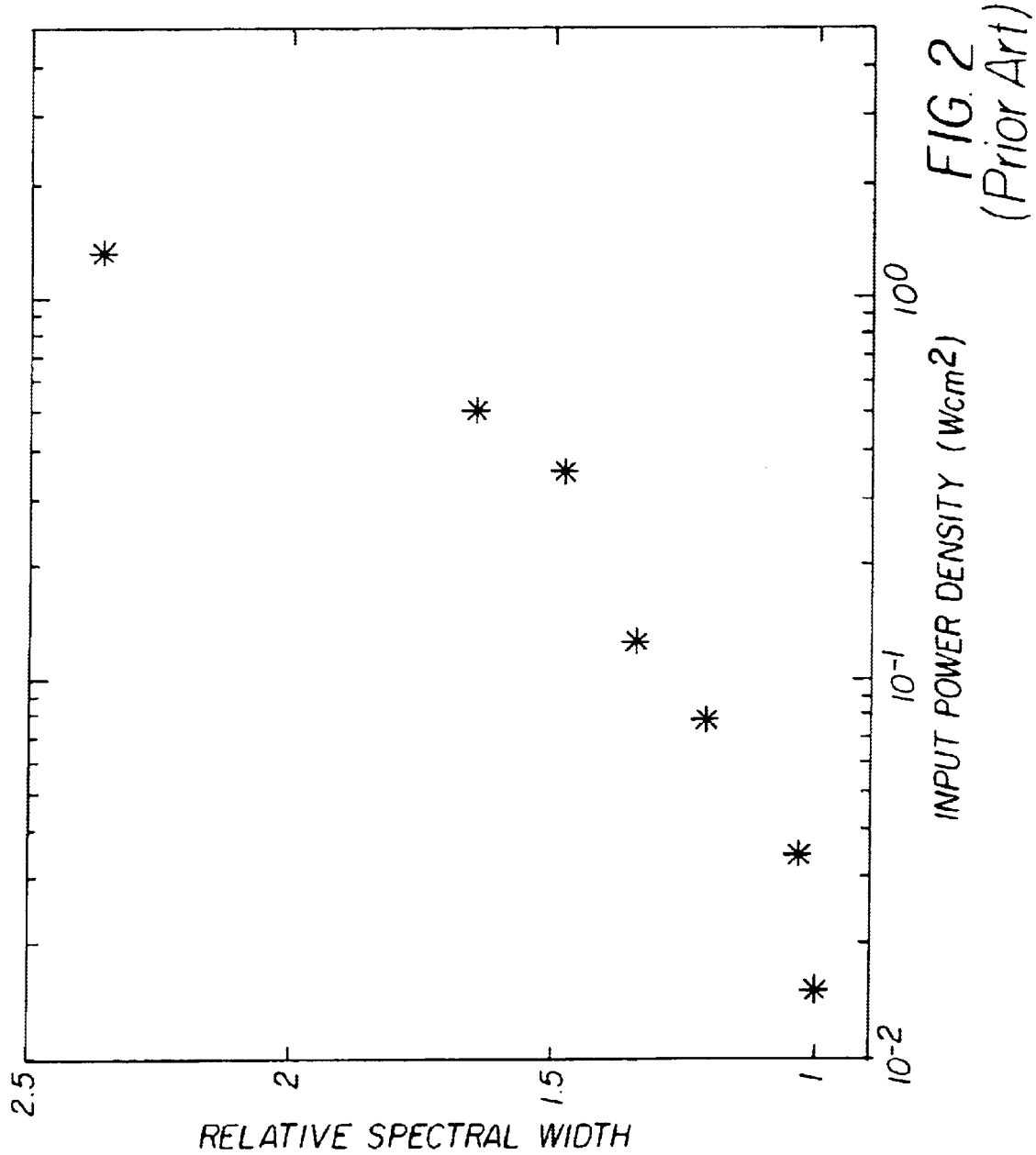
FIG. 2 is a graph which shows the relative spectral linewidth of the laser emission as a function of the input power for a prior art organic vertical cavity laser device.
Figure 8:
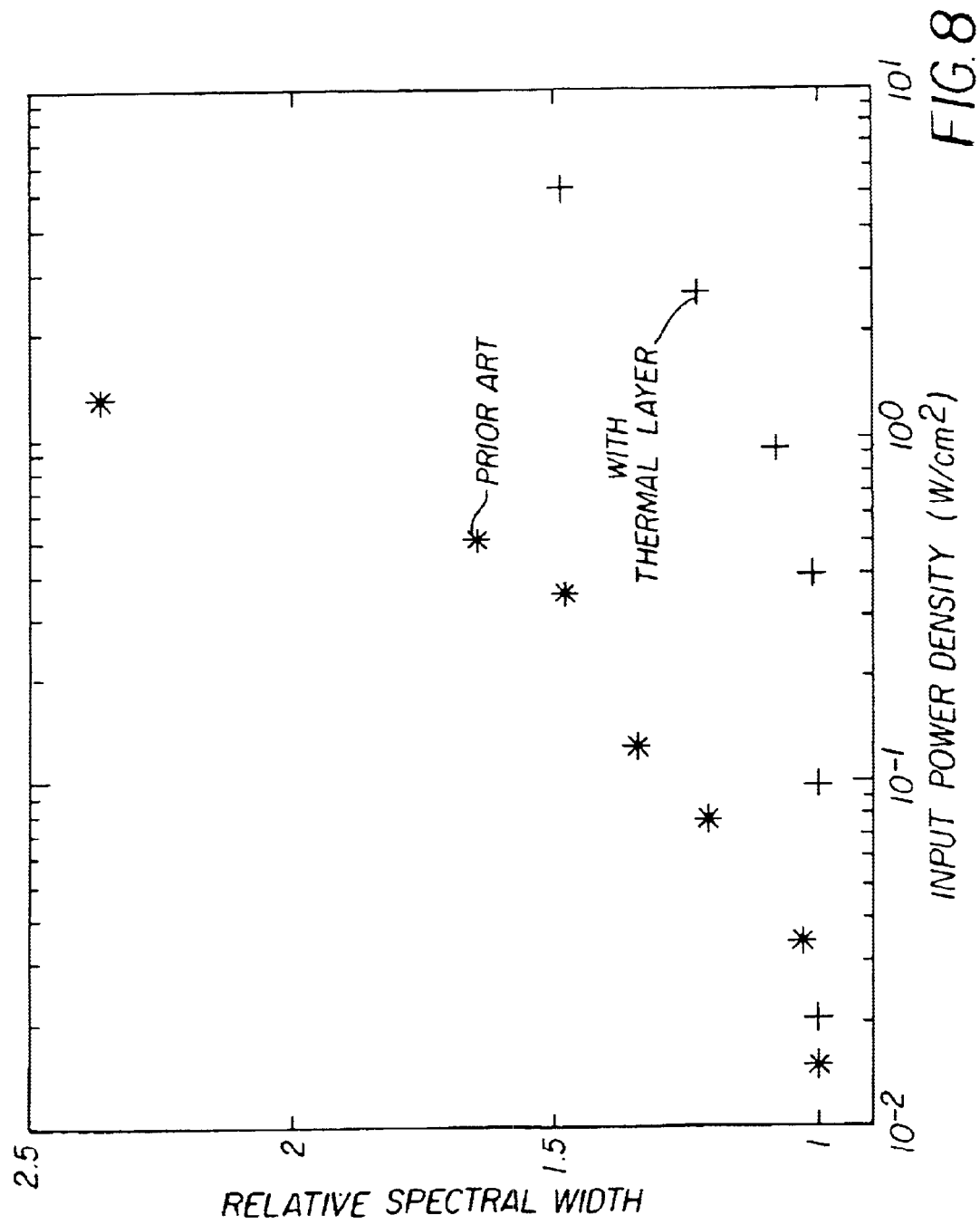
FIG. 8 is a graph which shows the relative spectral linewidth of the laser emission as a function of the input power for a prior art organic vertical cavity laser device and for a device made in accordance with the present invention.

FIG. 8 compares the relative spectral width of the laser emission for a prior art device (previously shown in FIG. 2) and for a device with a thermally conductive layer (Ag mirror) placed near the organic active region 40. The figure shows that the spectral width of the latter device doesn't begin to broaden significantly until a pump-beam power density of ~1 $W/cm^2$, while the prior art device spectrally broadens at a factor of 35 smaller pump-beam power density. The results from FIGS. 7 and 8 demonstrate that placing a thermally conductive layer adjacent to the organic active region 40 results in a significant improvement in the linear output power response of laser devices, in addition to markedly increasing the pump-beam power density at which spectral linewidth broadening becomes problematic.

The invention has been described in detail with particular reference to certain preferred embodiments thereof, but it will be understood that variations and modifications can be effected within the spirit and scope of the invention.

Parts List 10 vertical cavity organic laser device
20 substrate
30 bottom dielectric stack
35 thermally conductive transparent layer
40 organic active region
50 top dielectric stack
60 pump-beam
70 laser emission
100 periodic gain region
110 spacerlayer
120 electromagnetic field pattern
150 etched region
200 laser array device
210 interpixel region
220 lasing pixels

What is claimed is:

1. An organic vertical cavity laser device, comprising:

a) a substrate;

b) a bottom dielectric stack reflective to light over a predetermined range of wavelengths and being disposed over the substrate;

c) an organic active region for producing laser light;

d) a top dielectric stack spaced from the bottom dielectric stack and reflective to light over a predetermined range of wavelengths; and e) a thermally conductive transparent layer disposed between the bottom dielectric stack and the organic active region or between the top dielectric stack and the organic active region or both;

f) and the organic active region includes one or more periodic gain region(s) and spacer layers disposed on either side of the periodic gain region(s) and arranged so that the periodic gain region(s) is aligned with the antinodes of the device's standing wave electromagnetic field.

2. The organic vertical cavity laser device of claim 1 wherein pump-beam light is transmitted and introduced into the organic active region through at least one of the dielectric stacks.

3. The organic vertical cavity laser device of claim 1 wherein one or more periodic gain region(s) is a combination of a host material and a dopant and the spacer layers are substantially transparent to pump-beam light and laser light and are thermally conductive or non-thermally conductive.

4. The organic vertical cavity laser device of claim 1 wherein the thermally conductive transparent layer includes diamond-like carbon or silicon carbide.

5. The organic vertical cavity laser device of claim 3 wherein each of the spacer layers includes diamond-like carbon or silicon carbide.

6. An organic vertical cavity laser array device, comprising:
   a) a substrate;
   b) a bottom dielectric stack reflective to light over a predetermined range of wavelengths and being disposed over the substrate;
   c) an organic active region for producing laser light;
   d) a top dielectric stack spaced from the bottom dielectric stack and reflective to light over a predetermined range of wavelengths;
   e) a thermally conductive transparent layer disposed between the bottom dielectric stack and the organic active region or between the top dielectric stack and the organic active region or both; and
   f) an etched region formed in a surface of the bottom dielectric stack to define an array of spaced laser pixels which have higher reflectance than the interpixel regions so that the array emits coherent phase-locked laser light.
   g) and the organic active region includes one or more periodic gain region(s) and spacer layers disposed on either side of the periodic gain region(s) and arranged so that the periodic gain region(s) is aligned with the of the antinodes of the device's standing wave electromagnetic field.

7. The organic vertical cavity laser array device of claim 6 wherein pump-beam light is transmitted and introduced into the organic active region through at least one of the dielectric stacks.

8. The organic vertical cavity laser array device of claim 6 wherein one or more periodic gain region(s) is a combination of a host material and a dopant and the spacer layers are substantially transparent to pump-beam light and laser light and are thermally conductive or non-thermally conductive.

9. The organic vertical cavity laser array device of claim 6 wherein the spacing between pixels is in the range of 0.25 to 4 microns.

10. The organic vertical cavity laser array device of claim 6 wherein the pixels are arranged in a linear array.

11. The organic vertical cavity laser array device of claim 6 wherein the pixels are arranged in a two-dimensional square array.

12. The organic vertical cavity laser array device of claim 6 wherein the thermally conductive transparent layer includes diamond-like carbon or silicon carbide.

13. The organic vertical cavity laser array device of claim 8 wherein each of the spacer layers includes diamond-like carbon or silicon carbide.

* * * * *